United States Patent [19]

Musk

[11] Patent Number: 4,983,009
[45] Date of Patent: Jan. 8, 1991

[54] LIGHT TRANSMITTING DEVICE UTILIZING INDIRECT REFLECTION

[75] Inventor: Robert W. Musk, Ipswich, United Kingdom

[73] Assignee: BT&D Technologies Limited, England

[21] Appl. No.: 391,543

[22] PCT Filed: Nov. 28, 1988

[86] PCT No.: PCT/GB88/01047
§ 371 Date: Jul. 28, 1989
§ 102(e) Date: Jul. 28, 1989

[87] PCT Pub. No.: WO89/05467
PCT Pub. Date: Jun. 15, 1989

[30] Foreign Application Priority Data
Dec. 3, 1987 [GB] United Kingdom ............... 8728342

[51] Int. Cl.[5] ............................ G02B 6/32; H01J 5/16; H01L 39/02
[52] U.S. Cl. .......................... 350/96.18; 350/96.17; 350/96.20; 250/227.11; 357/19; 357/80
[58] Field of Search ............... 350/96.10, 96.11, 96.15, 350/96.16, 96.17, 96.18, 96.20; 357/17, 19, 30, 74, 80; 250/227.11

[56] References Cited

U.S. PATENT DOCUMENTS

| | | | |
|---|---|---|---|
| 4,182,977 | 1/1980 | Stricklin, Jr. | 315/158 |
| 4,245,884 | 1/1981 | Magura et al. | 350/96.16 |
| 4,297,653 | 10/1981 | Scifres et al. | 331/94.5 S |
| 4,699,453 | 10/1987 | Roberts | 350/96.20 |
| 4,701,010 | 10/1987 | Roberts | 350/96.17 |
| 4,767,171 | 8/1988 | Keil et al. | 350/96.18 |
| 4,830,453 | 5/1989 | Khoe | 350/96.18 |
| 4,841,344 | 6/1989 | Heinen | 350/96.18 X |
| 4,854,659 | 8/1989 | Hamerslag et al. | 350/96.15 |
| 4,875,750 | 10/1989 | Spaeth et al. | 350/96.18 |
| 4,897,711 | 1/1990 | Blonder et al. | 350/96.17 X |

FOREIGN PATENT DOCUMENTS 0199565 10/1986 European Pat. Off. ..... 350/96.15 X

*Primary Examiner*—Brian Healy
*Attorney, Agent, or Firm*—Nixon & Vanderhye

[57] ABSTRACT

An optical transmitter assembly comprises a laser (2) and an optical detector (4) arranged to receive light output from the laser (2) indirectly via a spherical lens (3). The source (2) and the detector (4) are mounted on a common support structure (1), and the lens (3) is mounted directly on the detector (4).

19 Claims, 1 Drawing Sheet

LIGHT TRANSMITTING DEVICE UTILIZING INDIRECT REFLECTION

BACKGROUND OF THE INVENTION

This invention relates to light sources and in particular though not exclusively to optical transmitters.

Optical transmitters have an important application in optical communications systems employing optical fibres as transmission medium.

One of the major obstacles to the practical implementation of optical communication systems is the difficulty of achieving sufficiently accurate alignment in and of the various system and subsystem components, and maintaining that alignment for extended periods which may be as long as the lifetime of the components.

The difficulty stems from the small dimensions of the components concerned. Particularly where transmission over single mode fibre is concerned, even minute misalignments of the order of a micrometre or less can cause noticeably increased transmission losses.

The active region of a typical semiconductor laser is of the order of 2 μm in cross-section. The core of a single mode fibre is about 5 μm to 10 μm in diameter. In a conventional laser transmitter, the active region needs to be aligned with the fibre core. For practical reasons it is often necessary also to space the end of the fibre by a small distance, typically 20 to 25 μm for a lensed fibre end, from the adjacent laser face. This reduces the required accuracy of alignment in practice to about 1 to 2 μm if excessive coupling losses between the laser and the fibre are to be avoided.

A further alignment is usually required between the back facet of the laser, that is to say the laser facet opposite that facing the fibre, and a monitoring photodetector. The usually much larger active area of the photodetector, typically 250 μm or more in diameter for a slow speed monitoring device, relaxes the required accuracy of alignment somewhat. However, light needs to be incident on the active area from above (or below) the major plane of the device. This is achieved conventionally by mounting the photodetector with its major plane perpendicular to the active region of the laser. This approach is adopted despite the practical difficulties of handling a detector device in that orientation during assembly, and finding a satisfactory way of making electrical connections to the photodetector, for example. Problems of this nature adversely affect production costs, and present an obstacle to high volume production in particular.

SUMMARY OF THE INVENTION

The present invention aims to provide an optical transmitter assembly of a relatively simple structure which readily lends itself to high volume production.

According to the present invention, an optical transmitter assembly comprises an optical source and an optical monitoring detector arranged to receive light output from the source indirectly via a light refraction means, wherein the source, the detector and the light refraction means are mounted on a common support structure.

The light source will typically be a semiconductor laser device, although in other applications the light source may be a non-lasing device such as a light emitting diode or an optical amplifier.

Conveniently, the light refracting means serve the primary purpose of focusing light from the light source into an optical fibre, or another recipient device.

Preferably, the refracting means comprise a lens (which may be an element of a compound lens structure) directly affixed to the monitoring detector. The lens is advantageously a spherical lens. The lens may be arranged relative to the source and the detector such that a portion of the light passing through it is directed onto the photodetector by reflection, repeated reflection if necessary, at the boundary of the lens.

Light may instead be directed onto the photodetector by light scatter in the lens material; frequently both reflection and scatter mechanisms will be present.

In order to increase the amount of light reaching the photodetector, the lens is conveniently mounted on the detector by an adhesive with a refractive index greater than that of air, thereby effectively extending the optical contact cross-section between the lens and the photodetector.

The support structure may conveniently be a generally planar substrate, preferably of electrically insulating, thermally conductive material. Any one or more of the aforementioned components may be affixed directly to the substrate or be affixed to subsidiary support structures which are, in turn, affixed to or formed on the common substrates.

The laser or other light source is conveniently mounted with its light generating region, in the case of a laser or an LED its active region, away from the support or substrate, in contrast to many earlier arrangements where the preferred arrangement was to mount the laser with its active area nearest the substrate.

The photodetector is conveniently mounted on the substrate such that the face affording entry of incident light to its active area lies in a plane substantially parallel with the mounting surface of the substrate.

The lens may be anti-reflection coated for high performance devices to minimise reflections into the optical source.

In the case of an optical amplifier, lenses can be similarly mounted on respective photo-detectors at the input and output ends to provide means for monitoring and controlling the amplifiers.

The common substrate conveniently comprises a monolithic block of electrically insulating but thermally conductive material, the thermal conductivity being required for dissipation of the heat generated in the light source. Using an electrically insulating material permits appropriate conductor tracks to be formed on the substrate, by metal deposition for example.

The support structure may further provide surface areas for anchorage points for an associated optical fibre, control circuits, and the like.

DETAILED DESCRIPTION OF THE DRAWINGS

The invention will now be described further by way of example and with reference to the accompanying drawings of which:

DETAILED DESCRIPTION OF ILLUSTRATIVE EMBODIMENTS OF THE INVENTION

Figure 1:
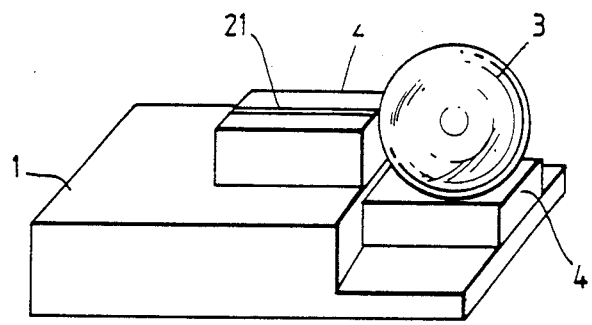
FIG. 1 is a schematic perspective view of an optical transmitter assembly.
Figure 2:
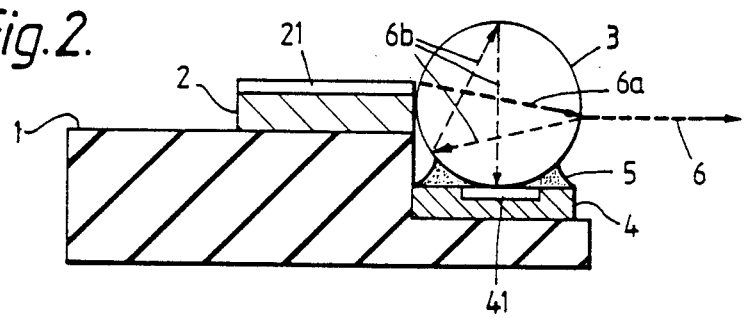
FIG. 2 is a side view of the assembly of FIG. 1.

Referring now also to FIGS. 1 and 2 of the drawings, an optical transmitter assembly comprises a laser 2, a photodetector 4 and a spherical lens 3, all mounted on a common stepped substrate 1. The substrate 1 is of a material which is chosen to provide thermal dimensional stability, and good heat conduction and electrical insulation.

The laser 2 may be any one of a variety of suitable semiconductor laser devices, the detailed structure of the semiconductor device being largely immaterial to the performance and understanding of the present invention.

The approximate location of the active region of the laser device is indicated schematically by the narrow stripe 21. The laser 2 may be affixed to the substrate 1 by soldering or in some other suitable manner which allows heat conduction from the laser to the substrate and also provides electrical continuity to appropriate conductor tracks (not shown) on the top surface of the substrate 1. In FIGS. 1 and 2 the laser is shown with its active region uppermost; the laser may equally be mounted with the active region nearest the substrate.

The optical output of the laser is coupled via a lens 3 into an optical fibre (not shown) in the manner described below.

As can be seen from FIG. 2 in particular, the laser 2 is mounted so that its active region 21 is remote from, and extends parallel to, the top surface of the substrate 1.

The photodetector comprises a planar photodiode 4 having its entry face in a plane parallel to the top surface of the substrate 1. Instead of being a device with a planar device structure the photodiode may have a mesa structure, for example. The photodiode 4 is affixed to the substrate 1 in a similar manner to the laser 2, with electrical connection being made via the bottom surface of the body of the photodiode 4 via a first conductor track and by a bond wire from another conductor track to a suitable bonding area of the photodiode 4. The photodiode 4 serves to monitor the total optical output of the laser 2 by receiving and sensing a portion of the optical output of the laser 2, which portion of light is directed onto the active area of the photodiode 4 via internal reflections and/or scattering in the lens 3 as schematically illustrated in FIG. 2 by arrows 6b.

The lens 3 is a spherical lens of, for example, sapphire or high refractive index glass with a refractive index greater than 1.7. For many applications a refractive index in the range 1.9 to 2.2 is the preferred. The practical optimum value for the refractive index will vary with the application concerned as it involves, for example, a trade-off between reflection from the lens surfaces and the lightgathering ability of the lens. The dimensions of the lens will typically be 200 to 500 $\mu$m, although larger (up to about 2 mm) and smaller (down to 150 $\mu$m) lenses may be used if appropriate.

The lens 3 is affixed by means of adhesive 5 to the top of the photodetector 4. The adhesive will typically be a light curable adhesive; its refractive index should be greater than the refractive index of the surrounding air to allow not only light internally reflected from the lens boundary, but also light scattered within the lens, to be coupled into the photodiode 4.

The portion of optical power from the laser 2 which is incident on the entry face 41 of the photodiode 4, where it is converted into a corresponding electrical output voltage appearing across conductive tracks is light which would normally have been lost from transmission.

The present arrangement readily permits mounting of the laser diode 2 with its active region uppermost or nearest the substrate. Mounting the laser diode with its active region uppermost has, however, has several significant advantages. Firstly, it avoids spurious interference effects which can arise from the very narrow virtual diffraction slit formed between the active region 21 and the surface 41 when the active region 21 is immediately adjacent the surface 41. Secondly, mounting the laser with its active region lowermost requires much more accurate alignment between the front facet of the laser and the corresponding edge of the substrate: if the substrate projects beyond the laser, the aforementioned interference effects will occur; if the laser overhangs the substrate heat conduction away from the active area is adversely affected leading to reduced device lifetime, or lower reliability, or both.

Moreover, if the laser is affixed by soldering to the substrate with its active region 21, nearest the substrate, the formation of even a small solder bump may obstruct the light output of the laser and, again, cause interference effects. Using the approach of the present invention allows the laser 2 to be mounted with its active area 21, uppermost, and hence not only largely avoids these problems, but the use of the lens 3 further relaxes the lateral alignment tolerances between laser and fibre. The spacing of the lens 3 from the front facet of the laser is typically a few $\mu$m, depending upon the type of lens chosen (eg whether the lens is a spherical lens, or a graded index lens, etc).

By using a spherical lens, spurious reflection from a cleaved fibre endface can be minimised by providing a lateral and/or angular offset between the fibre and the laser 2.

A further advantage of employing the arrangement according to the present invention is that the laser can be designed for 100% reflection at its back facet, resulting in improved laser power output.

Figure 3:
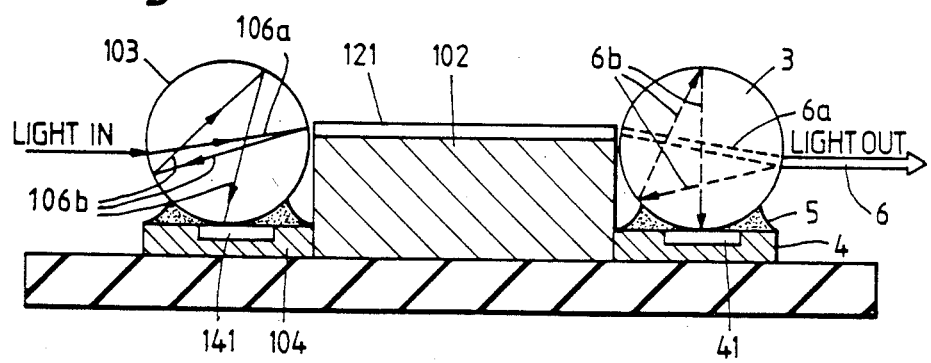
FIG. 3 is a side view of an optical amplifier assembly.

As shown in FIG. 3, the invention may also be applied to an optical amplifying device. Referring now to FIG. 3, the optical amplifier 102 shown there comprises a laser-like semiconductor structure with an active region. As before, knowledge of the operation of the device is largely immaterial for an understanding of the present invention. Briefly, unlike in the case of a laser, the endfaces of the semiconductor structure are made non-reflecting by application of an anti-reflection coating, for example. Thus, no resonant cavity is formed and the device is incapable of lasing, but can act like a travelling wave amplifier for light incident upon it.

Undesirable reflection from the external lenses 3 and 103 can be largely avoided by ensuring that the axis of the active region 121 does not intersect the lens surface at right angles.

As in the case of the lens in FIGS. 1 and 2, the photodiodes 4 and 104 can be connected to suitable electronic circuits. By providing photo diodes at each end of the amplifier which monitor input and output powers respectively, amplifier parameters such as gain can be readily controlled.

I claim:

1. An optical transmitting assembly comprising:

an optical source having an optical output coupled to pass directly through a light refraction means towards a first light output port, and an optical monitoring detector arranged to receive scattered light output from the source indirectly via at least one internal reflection of said light refraction means and a second light output port, wherein the source, the detector and the light refraction means are mounted on a common support structure.

2. An assembly as claimed in claim 1 wherein the optical source comprises a semiconductor laser.

3. An assembly as claimed in claim 1 wherein the optical source comprises a non-lasing device.

4. An assembly as claimed in claim 3 wherein the optical source is a light emitting diode.

5. An assembly as claimed in claim 4 wherein the optical source is an optical amplifier.

6. An optical transmitting assembly comprising:

an optical source and an optical monitoring detector arranged to receive light output from the source indirectly via a light refraction means, wherein the source, the detector and the light refraction means are mounted on a common support structure; and wherein the light refracting means serve the primary purpose of focusing light from the light source into or from an optical fibre.

7. An optical transmitting assembly comprising:

an optical source and an optical monitoring detector arranged to receive light output from the source indirectly via a light refraction means, wherein the source, the detector and the light refraction means are mounted on a common support structure; and wherein the refracting means comprise a lens directly affixed to the monitoring detector.

8. An optical transmitting assembly comprising:

an optical source and an optical monitoring detector arranged to receive light output from the source indirectly via a light refraction means, wherein the source, the detector and the light refraction means are mounted on a common support structure; and wherein the support structure is of electrically insulating material.

9. An optical transmitting assembly comprising:

an optical source and an optical monitoring detector arranged to receive light output from the source indirectly via a light refraction means, wherein the source, the detector and the light refraction means are mounted on a common support structure; and wherein the photodetector is mounted on the substrate such that its face affording entry of incident light to its active area is substantially coplanar with the mounting surface of the substrate.

10. An optical transmitting assembly as claimed in claim 6, wherein the light-refracting means comprises a spherical lens.

11. An optical transmitting assembly comprising:

an optical signal source having an optical signal output facet;

a passive optical signal refractor which refractively couples said optical output facet to a first optical signal output path and which also produces some internally reflected and scattered light which exits said refractor through at least one further optical signal output path; and an optical signal detector optically coupled to said further optical signal output path thereby to monitor a sample of optical signals exiting from said source output facet onto said first output path via said refractor.

12. An optical transmitting assembly as in claim 11 wherein said optical signal source includes optical feedback sufficient to produce lasing oscillation therewithin.

13. An optical transmitting assembly as in claim 11 further comprising:

a one-piece stepped support structure supporting said source and said detector, said refractor being supported, at least in part, by said detector.

14. An optical transmitting assembly as in claim 13 wherein said detector has an optically sensitive input face disposed perpendicular to said amplifier output facet.

15. An optical transmitting assembly as in claim 13 wherein said support structure is an electrically insulating material.

16. An optical transmitting assembly as in claim 11 wherein said optical signal source is an optical amplifier also having an optical signal input facet, said assembly further comprising:

a second passive optical signal refractor which refractively couples an optical signal input path to said input facet and which also produces some internally reflected and scattered light which exits said second refractor through at least one additional optical signal output path; and a second optical signal detector optically coupled to said additional optical signal output path thereby to monitor a sample of optical signals incoming from said input path to said input facet via said second refractor.

17. An optical transmitting assembly as in claim 16 further comprising:

a one-piece stepped support structure supporting said amplifier and both said detectors, each of said refractors being supported, at least in part, by a respective one of said detectors.

18. An optical transmitting assembly as in claim 17 wherein said input and output facets are parallel to one another and perpendicular to an optically sensitive input face of both said detectors.

19. An optical transmitting assembly as in claim 17 wherein said support structure is an electrically insulating material.

* * * * *